United States Patent [19]

Shipley

[11] Patent Number: 4,902,610
[45] Date of Patent: Feb. 20, 1990

[54] METHOD FOR MANUFACTURE OF MULTILAYER CIRCUIT BOARD

[75] Inventor: Charles R. Shipley, Newton, Mass.

[73] Assignee: Shipley Company Inc., Newton, Mass.

[21] Appl. No.: 54,102

[22] Filed: May 20, 1987

Related U.S. Application Data

[63] Continuation of Ser. No. 761,843, Aug. 2, 1985, abandoned.

[51] Int. Cl.⁴ .............................................. G03C 5/16
[52] U.S. Cl. ................................. 430/312; 430/315; 430/319
[58] Field of Search ............... 430/312, 313, 314, 315, 430/319, 394

[56] References Cited

U.S. PATENT DOCUMENTS

| | | | |
|---|---|---|---|
| 3,573,973 | 4/1971 | Drotar et al. | 427/98 |
| 3,791,858 | 2/1974 | McPherson et al. | 430/314 |
| 3,799,816 | 3/1974 | Schneble et al. | 156/644 |
| 4,089,686 | 5/1978 | Townsend | 430/324 |
| 4,107,351 | 8/1978 | James et al. | 427/43 |
| 4,157,407 | 6/1979 | Peiffer | 430/313 X |
| 4,469,777 | 9/1984 | O'Neil | 430/315 |
| 4,528,259 | 7/1985 | Sullivan | 430/312 |
| 4,567,062 | 1/1986 | Fan | 427/96 |
| 4,572,764 | 2/1986 | Fan | 156/630 |
| 4,631,111 | 12/1986 | Williston | 156/630 |
| 4,737,446 | 4/1988 | Cohen et al. | 430/311 |

OTHER PUBLICATIONS

Bolda et al., "Multilayer Circuit Fabrication", *IBM Tech. Discl. Bulletin*, vol. 13, No. 11, Apr. 1971, p. 3429.
"Four Strategies", *Electronic Business*, Aug. 1984, p. 90.

Primary Examiner—Jose G. Dees
Attorney, Agent, or Firm—Robert L. Goldberg

[57] ABSTRACT

The invention is for the formation of multilayer circuit boards where layers are formed sequentially using selective plating techniques and photoimaging of permanent dielectric materials to achieve fine line resolution and interconnections between circuits. The invention permits the sequential formation of multilayers of higher density using photoimaging techniques.

7 Claims, 2 Drawing Sheets

METHOD FOR MANUFACTURE OF MULTILAYER CIRCUIT BOARD

This is a continuation of copending application Ser. No. 761,843 filed on Aug. 2, 1985 abandoned.

BACKGROUND OF THE INVENTION

1. Introduction

This invention relates to methods for the manufacture of multilayer circuit boards and to the boards produced thereby, and more particularly, to methods for making multilayer boards by sequential formation of layers having signal layers separated from each other by layers containing conductive interconnections using permanent light sensitive coatings.

2. Description of the Prior Art.

Multilayer circuit fabrication is a means for providing multiple circuits in minimal volume. Multilayer boards typically comprise a stack of layers with signal lines (conductors) separated by a power and/or ground plane layer with the signal lines on one layer connected to the signal lines of another layer by plated holes known as "buried vias". The several layers are frequently bonded together with a pre-preg of a B-stage resin impregnated into a glass cloth fabric. Thus a complex multilayer stack can be illustrated as follows (absent the pre-preg layers):

| Layer 1 | Signal | |
|---------|--------|-----|
| | | via |
| Layer 2 | Signal | |
| Layer 3 | Power | |
| Layer 4 | Ground | |
| Layer 5 | Signal | |
| | | via |
| Layer 6 | Signal | |
| Layer 7 | Power | |
| Layer 8 | Ground | |
| Layer 9 | Signal | |
| | | via |
| Layer 10 | Signal | |
| Layer 11 | Power | |
| Layer 12 | Ground | |
| Layer 13 | Signal | |
| | | via |
| Layer 14 | Signal | |
| etc. | | |

Current processes for fabricating multilayered boards are extensions of methods used for fabricating double-sided boards. The conventional method comprises fabrication of separate innerlayers composed of circuit patterns with numerous conductors. These innerlayers are formed in a manner analogous to the formation of single-sided or double-sided boards. A photosensitive material is coated over the copper surfaces of a copper clad innerlayer material, imaged, developed and etched to form a conductor pattern in the copper cladding protected by the photosensitive coating. After etching, the photosensitive coating is stripped from the copper leaving the circuit pattern on the surface of the base material. A multilayer stack is then formed by preparing a lay-up of innerlayers comprising signal layers, ground plane layers, power plane layers, etc., typically separated from each other by a pre-preg which is a layer consisting of glass cloth impregnated with partially cured material, typically a B-stage epoxy resin. The outer layers of the stack (those on the top and bottom of the stack) often comprise copper clad glass filled epoxy board material with the copper cladding comprising the exterior surfaces of the stack. The stack is laminated to form a monolithic structure using heat and pressure to fully cure the B-stage resin.

Interconnects or through-holes, buried vias and blind hole interconnects are used to connect circuit layers within the multilayer board. The buried vias are plated through holes connecting two sides of an innerlayer. Blind vias typically pass through one surface of the stack and pass into and stop within the stack. Regardless of the form of interconnection, holes are generally drilled at appropriate locations through the stack. The holes are catalyzed by contact of the multilayer structure with a plating catalyst and the hole walls are metalized, typically with electroless copper overplated with electrolytic copper, to provide electrical contact between circuit innerlayers.

The uses, advantages and fabrication techniques for the manufacture of multilayer boards are described by Coombs, Printed Circuits Handbook, McGraw Hill Book Company, New York, 2nd edition, pp. 20-3 to 23-19, 1979, incorporated herein by reference.

Multilayer boards have become increasingly complex. For example, the boards used for main frame computers may have as many as 36 layers of circuitry, with the complete stack having a thickness of about ¼ inch. These complex boards are currently designed with 4 mil wide signal lines and 12 mil diameter vias for interconnecting signal line layers. For increased densification of a board, it would be desirable to reduce signal lines to a width of 2 mils or less and vias to a diameter of 2 to 5 mils or less.

Because of the number of layers comprising the multilayer board, and the practical necessity of minimizing thickness of complex multilayer boards, current manufacturing methods utilize innerlayer materials comprising a glass reinforced resin of about 4 to 5 mils in thickness. Typically, these innerlayer materials are clad with copper on both surfaces. Since the lamination of a multilayer stack is at a temperature above 150° C., the laminate shrinks upon cooling to ambient temperature, but only to the extent permitted by the copper cladding. In other words, the copper cladding restrains shrinkage. If the copper is etched to form a discontinuous pattern such as a pattern of signal lines, laminate shrinkage is no longer restrained by copper cladding. Consequently, further shrinkage occurs to the extent permitted by the glass reinforced resin. The coefficient of expansion differential between the copper and glass reinforced resin has an adverse effect on dimensional stability, especially on larger parts. Another substrate limitation having an adverse effect on dimensional stability is the flimsiness of the glass reinforced resin since the substrate is sensitive to stretching.

The above described dimensional stability problems are minimal, if not non-existent, when the copper clad innerlayer material is utilized as a power plane on one surface and a ground plane on the other surface. The reason is that the etched copper is in a continuous pattern which retains the innerlayer material and prevents further shrinkage. In addition, the remaining copper eliminates stretching problems.

The lamination procedure for the formation of a multilayer stack typically includes a lay-up of the following components prior to lamination using heat and pressure:

Signal innerlayer
pre-preg
power/ground plane innerlayer pre-preg
signal innerlayer
pre-preg
etc.

Extreme care must be exercised to avoid shifting of innerlayers during lamination. Otherwise, the layers will not be aligned and electrical contact between layers will not be achieved. In addition, caution must be exercised to avoid damage to narrow etched signal lines, especially when signal lines and open channels are opposite each other on both surfaces of the innerlayer. At this point, where open channels are opposite each other, because of copper removal, the total thickness of the innerlayer is that of the dielectric substrate which may be as thin as from about 4 to 5 mils.

When the components of a multilayer stack are laid up, as indicated above, air is necessarily trapped in the spaces adjacent to signal lines because a partially cured, solid pre-preg is laid over the signal lines which does not fill and cannot flow into the recesses between signal lines. Care has to be taken during lamination to evacuate entrapped air. Residual air pockets can cause defects and/or subsequent problems during use of the multilayer board. Consequently, it is highly desirable to find a method of manufacturing multilayer boards that avoids the problem of air entrapment.

A semi-additive method for the manufacture of multilayer printed circuit boards is disclosed in U.S. Pat. No. 3,791,858 incorporated herein by reference. In the process of this patent, an insulative substrate is flash coated with a conductive material such as a thin layer of copper. The copper is coated with a photosensitive material in a thickness equivalent to the desired conductor line of the circuit and a pin which is used as an interconnect between circuit planes. The photosensitive material is exposed and developed and the flash coat of conductive material bared by development of the photosensitive coating is electroplated, typically with copper, whereby copper deposits over the conductive material filling the channels within the photosensitive material and creating the pin interconnects where desired. The photoresist is then removed, the underlying flash coating of conductive material etched and the photosensitive coating material is replaced with a dielectric material. The process may be repeated as many times as desired until a monolithic multilayer stack of circuits is created having pins interconnecting the circuit planes.

It is believed that the process of the above patent is not in commercial use because of inherent difficulties with the process. For example, using electroplating techniques to plate interconnects is believed to place a lower limit on the diameter of the holes or pins because of inadequate throwing power or other limitations. In addition, the process is cumbersome because the process sequence comprises excessive steps such as applying a flash coat, applying a photosensitive material, then removing and replacing this photosensitive material with a dielectric and etching to remove the flash coat. Finally, for the process to be operative, the interconnect must be filled with metal. This precludes the option of plating only the hole wall so that a device can be soldered into a hole interconnect.

SUMMARY OF THE INVENTION

To better understand the description which follows, the following definitions have been adopted:

"Permanent photo dielectric coating" means a dielectric coating composition that is radiation sensitive and developable to yield a relief image, which dielectric coating becomes an integral part of the multilayer board, and which is used to define openings for conductive interconnections between circuit or signal layers.

"Permanent photo mask" has the same meaning as permanent photo dielectric coating except that the mask is used to define openings and channels for conductive signal lines and interconnections within a circuit or signal layer. The permanent dielectric coating and the permanent photo mask may be same or different materials.

Both the permanent photo mask and the permanent photo dielectric coating may be applied as a liquid coating composition or as a dry film and preferably has a dielectric constant not exceeding 4.5.

"Photoformed openings" mean a relief image of channels defining conductors and/or openings defining interconnections within a permanent photo dielectric coating or a permanent photo mask. The channels and openings are used to contain metal selectively deposited into the relief image to render the same electrically conductive.

The subject invention provides a simplified process for the manufacture of high density multilayer circuit boards in a form not heretofore possible in volume manufacture without the difficulties described above. The process comprises the sequential formation of layers comprising a multilayer circuit structure where the multilayer structure has at least two circuit layers with conductive interconnections between circuit layers.

The multilayer circuit structure is desirably formed over a temporary or permanent carrier that may become an integral part of the multilayer stack. For example, the carrier may be a circuit board substrate. If the carrier is a circuit, the process may comprise formation of a permanent photo dielectric coating over the circuit having a relief image of photoformed openings that define interconnections. The photoformed image is obtained by exposure of the photo dielectric coating to activating radiation in an image pattern and development to form the relief image. The photo dielectric coating may be coated with a photo mask in a photoformed pattern of conductors and interconnections where the openings define desired circuit geometry such as conductors and interconnections. Metal is selectively deposited within the relief image to render the same conductive. The walls of the photo dielectric and photo mask coatings contain the metal as it deposits and assures the desired geometry or cross sectional shape of the same. The process is repeated sequentially as many times as desired to form sequential layers of circuits and interconnections until a desired number of layers are formed. Alternatively, one section may be formed as described and this stack may then be stacked with other stacks formed by the same or different processes to form the multilayer composite. The composite would then be laminated with heat and pressure to form the multilayer board. For purposes of this invention, the stacks may first be coated with a liquid resin and the liquid resin partially cured prior to lay-up. In this way, any crevices are filled with the liquid resin and air entrapment is eliminated.

If the carrier is other than a circuit, the process described above is modified as necessary. For example, the carrier might be a treated stainless steel platen. If so, a photo mask may be deposited on the platen and the circuit electroplated into the openings within the photo mask. This circuit would be the first circuit of the multilayer stack. A layer of interconnections through a permanent photo dielectric coating could then be formed over the circuit and the process repeated until the desired number of layers of interconnections and circuits are sequentially formed to form the multilayer stack. At the conclusion of the process, or at any point when the stack is of sufficient strength, the platen may be removed.

In a process of the type contemplated herein, it should be understood that not all layers of a multilayer circuit are in electrical communication with each other. For example, an electrically isolated ground or power plane may comprise several of the layers in the multilayer stack with interconnections passing through the plane electrically isolated therefrom.

Illustrative of one embodiment of the invention, the process of fabrication of several layers of a multilayer structure might comprise the following steps:

a. provide a carrier having a circuit over at least one of its surfaces;

b. apply a photo dielectric coating over the circuit and photoform openings for interconnections;

c. apply a photo mask over the previously formed photo dielectric coating and photoform openings for conductors and interconnections;

d. selectively plate metal in the openings to render the interconnections and conductors conductive; and e. repeat the process as often as desired to form a stack of circuits and conductive interconnections between circuits.

The use of a carrier, a photo dielectric and photo mask that become a permanent part of the circuit, photoforming, selective metal deposition, sequential formation of layers and permanent or temporary carriers characterize the invention.

Selective metal deposition in accordance with the invention may be performed in conventional manner or by new techniques to be described in greater detail below. Many of the procedures employed for selective metal deposition utilize a plating catalyst.

To obtain a relief image in the photo dielectric and/or photo mask coatings, the coating is exposed to activating radiation in an image pattern and developed to yield the pattern of photoformed openings and lines. The resolution of the openings is dependent upon the photo properties of the coating materials used and upon the light source collimation. Such materials may be capable of development to yield high resolution relief images including openings that are smaller than the thickness of the coating. By use of such coatings, openings for interconnects and conductors can be imaged to a size equivalent to the resolution capability of the photo dielectric and photo mask in any shape desired. With high resolution materials, the conductors and openings can be reduced to less than 1 mil in width and can be reduced down to a few microns in width if desired.

Sequential formation of layers in part characterizes the invention. However, it should be realized that several stacks can be made by the sequential formation of layers. Two or more stacks formed in this manner may be laminated to each other to form a composite multilayer board. The stacks may be laminated together using a B-stage pre-preg of an epoxy impregnated into glass fabric. More preferably, the stacks are laminated together starting with an uncured, liquid resin rather than a pre-preg. The liquid resin fills any existing crevices within the stacks whereby air entrapment is avoided. Following coating with the liquid resin, the liquid coating is partially cured for handling purposes and the stacks are layed up and laminated. In addition to the above, a stack formed sequentially following the process of the invention may be laminated to a stack formed by a prior art procedure, using either the pre-preg or the uncured liquid resin. Consequently, multilayer boards can be formed though a combination of processes including integration of processes from the prior art and the process of this invention.

In summary, this invention simplifies the manufacture of multilayer boards and is especially useful for the manufacture of complex, highly densified multilayer boards. In some instances, the invention permits densification of multilayer boards that is impractical or impossible using prior art processes. While lamination of multilayer boards as typically performed in the prior art can be eliminated, the subject invention has advantages for conventional laminating processes as well. For example, the invention permits:

a. the use of innerlayer composites which include fine line circuitry with buried via interconnects which makes practical the use of line widths that may be as small as 2 mils or less;

b. the elimination of the need for the costly perforation of holes in innerlayers while permitting the formation of smaller openings of any size or shape and having widths of 2 mils or less;

c. elimination of the problems resulting from the use of glass cloth reinforced innerlayer substrates;

d. the capability of making conductors with square or rectangular cross sections as desired for impedance control;

e. the elimination of the risk of air entrapment during lamination as occurs in conventional processes;

f. the elimination of pre-preg substrates, thereby making it possible to automate lamination lay-up, with concomitant lowering of labor costs, and boards of higher quality;

g. through the use of innerlayer composites, reduction in the number of parts to be laminated together with possible greater control over board thickness and simplification in the lamination process with further reduction in the number of parts by elimination of the use of pre-pregs; and h. greater computer speed using boards of higher densification as a consequence of shorter conductor lines. Additional advantages and embodiments will be disclosed in greater detail in the description which follows.

DESCRIPTION OF THE PREFERRED EMBODIMENTS

The multilayer circuit, in accordance with the invention, is desirably formed over a carrier which may, if desired, become a part of the finished multilayer structure. The carrier may be permanent or temporary. A permanent carrier may comprise any of a number of different structures. For example, the carrier may be a conventional printed circuit board, a molded circuit, a hybrid circuit, ceramic, a housing for an item of electronic equipment, etc., each having a circuit thereon whereby additional layers may be added to the circuit. Another carrier may be an unclad plastic whereby multiple additive circuits may be sequentially built into a stack of circuits. A further embodiment of a permanent carrier may comprise a power and/or ground plane onto which multiple circuit layers may be formed. A temporary carrier may comprise a platen onto which multiple layers can be sequentially applied after which the multilayer stack can be separated from the platen. If the platen is a conductor such as a stainless steel platen, at least the first circuit layer may be formed using electroforming techniques whereby the imaged dielectric layer is formed on the platen and metal is electrolytically deposited onto the exposed portions of the platen. For manufacturing efficiency, circuits are desirably formed on both sides of the platen.

The method of forming the circuitry on the carrier is not critical to the invention. For example, the circuit can be formed using conventional print and etch methods whereby the circuit is formed by etching copper cladding masked by an etch resistant coating. Alternatively, the circuit can be formed additively or semi-additively by methods known to the art. Other methods for forming circuitry on a substrate known to the art include electroforming, conductive pastes and inks, etc. and do not constitute a part of this invention.

The process of the invention uses selective plating techniques. Selective plating techniques are not considered a part of the invention though the manner of using the selective plating techniques to form circuits in accordance with the description that follows is considered to be a part of the invention.

There are methods known in the art for selective plating. Selective plating can be accomplished using masks applied over catalyzed substrates, differential adsorption of a plating catalyst followed by stripping as exemplified in U.S. Pat. No. 3,562,038, sacrificial layers (believed to be novel method for selective plating), photo dielectric catalyzed layers, selective application of catalytic poisons, activation of copper surfaces with palladium solutions, photosensitive catalysis, etc.

Figure 1:
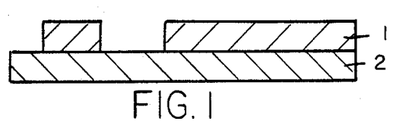
FIGS. 1 through 3 depict the cross section of a multilayer circuit formed over a copper clad innerlayer material at various stages during its fabrication.
Figure 2:
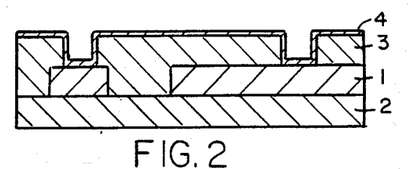
Figure 3:
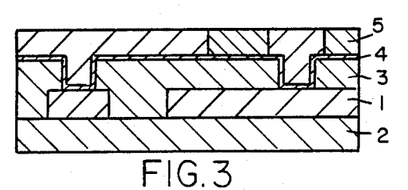
Figure 4:
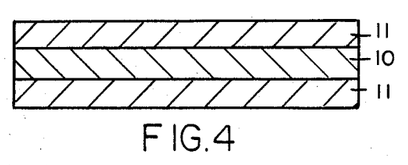
FIGS. 4 through 7 depict the cross section of a multilayer board having signal and interconnect planes formed over an innerlayer material having a ground and power plane during various stages of its fabrication.

FIGS. 1 through 3 of the drawings represent the formation of a multilayered stack comprising sequentially applied layers over a permanent carrier. In this embodiment of the invention, beginning with FIG. 1, the first step utilizes a conventional copper clad innerlayer material as a permanent carrier. The innerlayer material, as represented in FIG. 1 has been etched to form signal lines 1 over substrate 2.

In FIG. 2, a layer of photo dielectric 3, imaged to provide a relief image of photoformed interconnects between the signal lines 3 and a next subsequent layer (not shown), is coated over the composite. Plating catalyst 4 is then applied over the dielectric layer 3 to catalyze the surface for subsequent selective metal plating.

The next steps in the process are shown in FIG. 3 and comprise application of photo mask 5 in an image pattern of signal lines, vias, holes, etc. A photo mask is preferred for fine line imaging. The photo mask coats the catalyzed surface of dielectric layer 3 where plating is not desired. Copper conductors 6 are plated over the plating catalyst 4 not coated with the mask as illustrated, preferably within the thickness of the photo mask as shown, most preferably to a thickness that provides a nearly planar surface. At this point in the process, there is provided a complete circuit having a circuit pattern and interconnects. The procedure described above can be repeated as often as desired to form a stack of multiple circuits. Alternatively, the stack so formed can be laminated to other stacks formed by same or a different procedure using a suitable material to adhere the stacks together.

The material used to adhere stacks together in accordance with the invention may be a conventional prepreg. However, in accordance with a preferred embodiment of the invention, a liquid adhering agent is preferably applied over the stack and partially cured. In this way, the liquid penetrates any crevices that might be present on the surface of the stack whereby entrapped air pockets are eliminated. Following application of the adhering agent, for ease of handling, the adhering agent is preferably partially cured to a relatively dry state. The liquid adhering agent may be a resin of the type used in such processes prior to cure such as an uncured epoxy resin.

In the above process, the photo dielectric and photo mask layers are applied in art recognized manner. For example, they may be applied as a liquid coating composition and dried or as a dry film. If in the form of a dry film, the film may be a single layer film or may comprise multiple layers.

As is known in the art, contact of the plating solution with the plating catalyst results in autocatalytic deposition of electroless metal over the exposed plating catalyst. Plating continues until the structure is removed from the plating solution. The plating solution used is typically an electroless copper solution. A suitable solution is Cuposit® 251 electroless copper, a commercially available electroless copper plating solution available from Shipley Company Inc. of Newton, Mass. A preferred solution is one capable of plating ductile copper able to withstand a solder shock test of about 260° C. for 10 seconds without cracking. Plating is continued until the desired deposit thickness is achieved.

The process has been described in terms of electroless copper deposition. It should be recognized that other metals may be used or multiple layers of metals. For example, immersion tin or solder is often plated over a copper conductor.

In the above process, since the photo dielectric and photo mask define openings and channels into which metal deposits, the copper conductors and interconnects conform to the shape of the channel or opening. Though the substrate has catalyst adsorbed onto its entire surface, metal deposition is selective to the bared catalyst in the channels. If a high resolution photo mask or photo dielectric has been used to define the image pattern, the metal conductors will have a cross-section conforming to the channel into which it has been plated, typically square or rectangular. Consequently, there is better control over the impedance of the conductor.

The insulative innerlayer substrate material used in the prior art for the fabrication of multilayer boards is typically reinforced plastic having a thickness of approximately 4 to 8 mils to which copper metal has been clad on each of its surfaces. In the prior art, when a copper coating is etched to define the circuit on the innerlayer, the metal cladding between the conductors is removed and the thickness of the innerlayer material where the cladding has been removed may be as thin as 4 mils. Since the lamination of the copper cladding has been performed at a high temperature, typically above 150° C., the etching of the copper results in discontinuous circuitry, thereby relieving the plastic so that it can expand to its normal size at ambient temperature. Thus the coefficient of expansion differential between copper and plastic results in undesirable dimensional changes. Also, the very thin plastic substrate is subject to stretching or other distortion risks.

In contrast to the above, the spaces and conductors of the circuits formed in accordance with this invention, are imaged on substrates that are desirably dimensionally stable. Furthermore, the spacings between conductor lines are filled with dielectric material, thereby affording somewhat improved dimensional stability. Unlike the above, the use of a power plane/ground plane innerlayer substrate provides good dimensional stability even though the plastic substrate may be thin, because the copper pattern is continuous and does not relieve the plastic, thereby eliminating dimensional change after etching. Therefore, the layers have improved dimensional stability.

The openings for interconnections between layers are photoformed and not drilled. In accordance with this invention, it is possible to form a multilayer board without drilling. In this respect, all vias can be formed by photoforming and selective deposition though it may be desirable to drill holes from the exterior of the stack to its interior.

FIGS. 4 through 7 represent the fabrication of a multilayer board using procedures for formation of sequential layers similar to those depicted in FIGS. 1 through 3. However, in this embodiment, a copper clad innerlayer material is used as a carrier comprising innerlayer substrate 10 and copper cladding 11 on both of its surfaces. In this embodiment of the invention, the copper is used as a power/ground plane combination and consequently, is a continuous layer providing structural integrity to the innerlayer material. To electrically isolate the power and ground planes, a dielectric layer 12 is coated over the ground and power planes 11.

Figure 5:
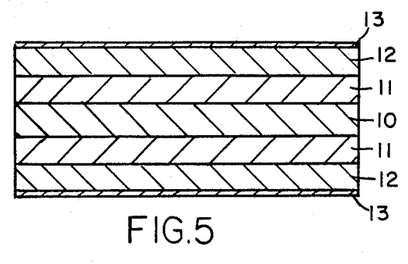
Figure 6:
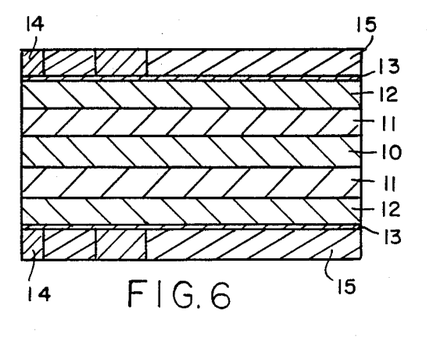

In FIG. 5, the composite has been immersed in an electroless plating catalyst to provide catalytic layer 13. A photo mask 14 is then applied over the catalyzed surface with photoformed openings defining a circuit pattern. The next step in the process comprises selective metal deposition of copper into the photoformed openings to provide conductors 15. Selective metal deposition is readily accomplished by immersion of the composite into an electroless copper plating solution whereby contact of the solution with the plating catalyst 13 results in deposition of copper to form conductors 15.

Figure 7:
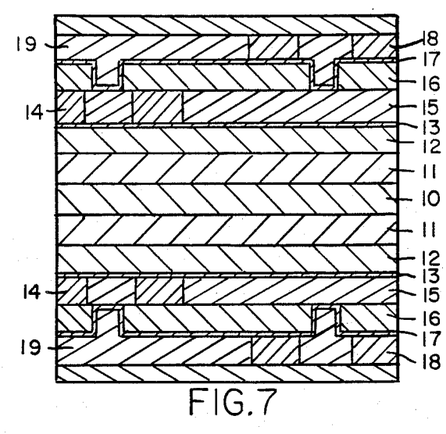

The next step in the process is the formation of conductive interconnections between copper conductors 15 and a subsequently applied signal layer. The results of this procedure are illustrated in FIG. 7 of the drawings. A photo dielectric layer 16 with photoformed openings is applied over the surface comprising conductors 15 and photo mask 14 and this layer is catalyzed with a layer of plating catalyst 17. Thereafter, a layer of a photo mask is applied over the catalyst layer 17 to mask those areas where plating is not desired and to define a signal layer. The composite is then immersed in an electroless plating solution whereby electroless copper deposits on the walls of the photoformed openings to provide copper interconnects and conductors 19. If the composite is left in the plating solution for a sufficient period of time, the photoformed openings will fill with the copper whereby a solid peg of copper comprises the conductive interconnection. Plating is preferably continued until the deposit is to the full thickness of dielectric 16 and photo mask layer 17 as shown in the drawing.

If the stack formed by the above process is to be used as part of a more complex structure and lamination is required, the stack so formed is coated with an uncured liquid epoxy resin. The liquid resin will infiltrate the crevices in the surface of the stack thereby eliminating entrapped air. For handling, the coated stack is partially cured whereby the epoxy is suitable for handling. The stack may then be laminated to another stack with heat and pressure, typically at a temperature in excess of 150° C.

Figure 8:
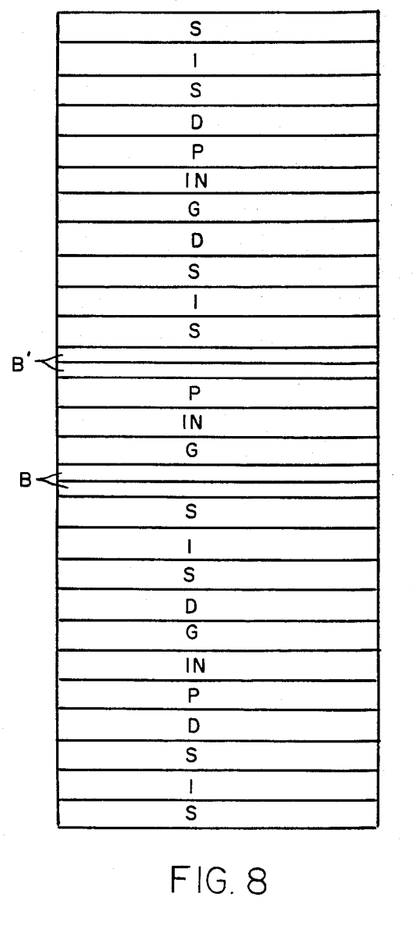
FIG. 8 illustrates a lay-up for the formation of a multilayer board using the multilayer formed by the process depicted in FIGS. 4 through 7.

A lamination procedure as described above is illustrated in FIG. 8 of the drawings. In FIG. 8, the six-layer stack shown in FIG. 7 is laminated to a similar six-layer stack through a dielectric substrate having a power and ground plane on its surfaces overcoated with a B-stage coating for adhesion. For simplification, letters are used to designate layers with the symbol S illustrating a signal layer, I illustrating an interconnect layer, P representing a power plane, D representing an insulating dielectric layer, G representing a around plane, B representing a B-stage resin used to adhere the stack together and In representing an innerlayer material.

In the foregoing description, selective deposition of electroless metal is accomplished primarily by defining a masked image over a catalyzed surface. For purposes of the invention, it should be understood that other methods of selective deposition are possible. For example, a sacrificial resist layer may be utilized to form a selectively catalyzed surface. This embodiment of the invention is illustrated in FIGS. 9 through 12 of the drawings where the formation of a single-sided circuit is depicted in part.

Figure 9:
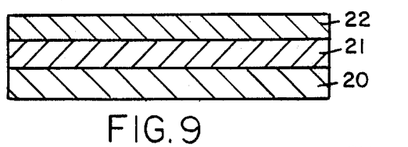
FIGS. 9 through 12 depict the formation of a layer using a sacrificial layer for selective catalysis.
Figure 10:
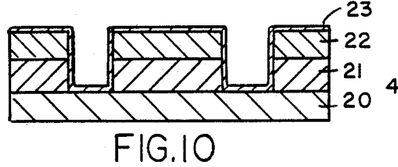

In FIG. 9, a carrier 20 is coated with a permanent photo mask 21. In FIG. 10, the photo mask layer 21 is coated with a sacrificial layer 22. The sacrificial layer 22 and the photo mask layer 21 are imaged in a conductor pattern and developed to yield photoformed channels in both layers. The entire surface is then catalyzed to provide a layer of plating catalyst 23 over the surfaces of the photoformed channels and holes.

Figure 11:
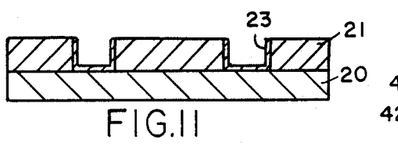
Figure 12:
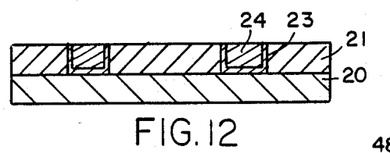

As shown in FIG. 11, the photo mask layer 22 is then removed with a suitable solvent whereby there remains a layer of catalyst in a desired pattern. The exposed catalyst layer 23 may then be selectively plated to desired thickness with plating metal as shown in FIG. 12. The circuit so formed may be completed in any manner desired such as that set forth above.

As a further alternative to the embodiments disclosed above, though a lesser preferred embodiment, the selective deposition can be achieved by admixing catalytic material directly with any of the dielectric coatings used in the process as illustrated in U.S. Pat. No. 3,756,893 incorporated herein by reference where copper oxide is admixed in a resinous binder and then activated for plating.

Figure 13:
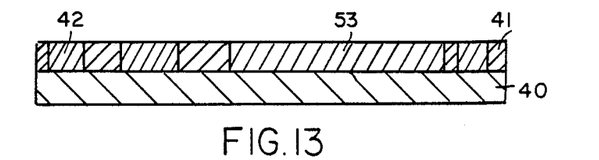
FIGS. 13 to 17 represent a cross-section of a multilayer array formed using electroforming procedures over a temporary platen during various stages of its fabrication.

The carrier does not have to become a part of the multilayer board. A temporary carrier can be used as illustrated in FIGS. 13 through 17 of the drawings wherein the formation of a stack having a conductive interconnection or peg running throughout the length of the multilayer stack is illustrated. With reference to FIG. 13, a temporary carrier 40 comprising a stainless steel sheet platen is coated with a permanent photo mask 41 in a desired image pattern. Copper conductors 42 are then electroplated directly into the defined channels because the stainless steel platen 40 is a conductor as required for electroplating. As copper plates on the platen, it continues to build to desired thickness.

Figure 14:
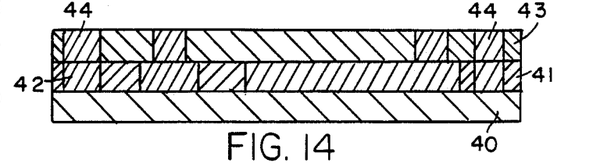

The next step in the process is shown in FIG. 14. A photo dielectric layer 43 is applied over the surface comprising photo mask 41 and copper conductors 42. Photo dielectric layer 43 has photoformed openings defining interconnections. These openings may be electroplated with copper to full thickness of layer 43, if desired to form solid pegs 44 that serve as interconnections. Direct electroplating is again possible because in this embodiment, stainless steel platen 40 provides conductivity to the holes through conductors 42 and the holes are not electrically isolated from conductors 42. If the holes had been electrically isolated, an alternative method for metal plating could comprise activating the copper conductors with an activator solution such as palladium chloride followed by plating copper by electroless deposition using a conventional electroless depositing solution.

Figure 15:
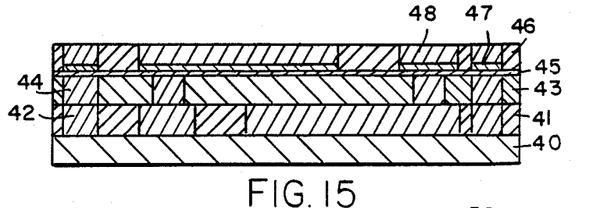

FIG. 15 illustrates the next steps in the process. A layer of catalyst 45 is applied over the surface consisting of photo dielectric coating 43 and copper interconnects 44. The catalytic layer is then overcoated with a layer of a photo mask 46 which defines conductor lines, interconnections, etc. An electroless layer of copper 47 may then be deposited over the plating catalyst layer 45 to full thickness, or, if desired and as illustrated in FIG. 15, once a thin layer of copper is deposited, an electrolytic copper layer 48 may be plated over the thin layer of electroless copper 47 to full desired thickness. The electroless layer of copper was required in this embodiment of the invention because the signal lines 48 were not in contact with a conductive material over their entire width.

Figure 16:
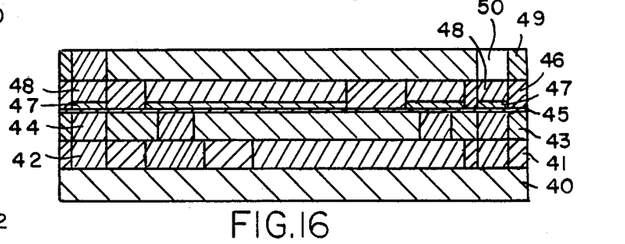

The above process can be repeated as often as desired. FIG. 16 illustrates a continuation of the process where an additional layer of photo dielectric 49 is coated over the composite surface comprising photo mask 46 and signal lines 47. The photo dielectric layer 49 defines the interconnections. In this case, the interconnections are in electrical communication with the stainless steel platen. Consequently, interconnections 50 may be electroplated to full desired thickness.

Figure 17:
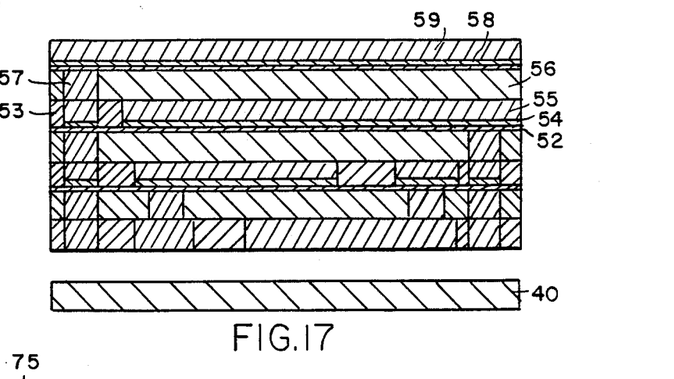

For multiple coatings, it is desirable to separate signal and interconnection layers with a ground plane, power plane combination. This can be accomplished by sequential coatings as illustrated in FIG. 17. The surface comprising interconnections 50 and photo dielectric layer 49 is coated with plating catalyst 52. A photo mask layer 53 is applied in an image pattern. A thin layer of electroless copper 54 is formed over plating catalyst 52 and this is overcoated with electrolytic copper 55 to form a power plane with an insulated interconnect passing through the power plane. Another interconnect layer comprising photo dielectric 56 is formed together with an electroplated interconnect 57. The surface comprising photo dielectric layer 56 and interconnect 57 is catalyzed, a thin layer of electroless copper 58 is deposited over the catalyst and an electrolytic copper layer 59 is deposited to form a ground plane.

Finally, as shown in FIG. 17, following formation of a desired stack, the platen 40 is removed as it served as a temporary carrier and source of conductivity, but was not intended to become part of the multilayer stack.

As described above, a complete multilayer board may be formed by sequential layering using the process of the invention. Alternatively, a stack comprising a portion of a multilayer board may be formed and laminated to another similar stack or a stack formed by procedures of the prior art. Regardless of how the final stack is formed, the process of the invention significantly simplifies the process of making printed circuits compared with prior art procedures.

Figure 18:
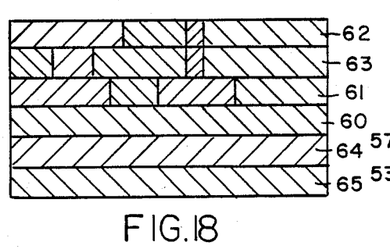
FIG. 18 comprises a circuit on one surface of a substrate and a multilayered metal deposit on the other surface where the combination as described may consist of a housing for an electrical component having a circuit on one surface and EMI shielding on the other surface.

FIG. 18 illustrates an embodiment of the invention where a circuit is formed on one surface of a substrate and a multilayered EMI deposit is formed on the other surface. As shown in the drawing, a substrate 60, which in this embodiment of the invention could comprise a housing for electronic equipment, has two layers of signal lines 61 and 62 joined by a layer of metalized interconnections 63 on one surface of substrate 60 and a layer of copper 64 overcoated with a layer of nickel 65 on its other surface. The layer of copper and nickel is preferably an electroless deposit and, as is known in the art, is capable of functioning to prevent EMI radiation from the electronic component.

Figure 19:
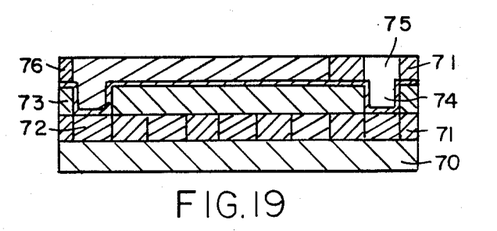
FIG. 19 depicts a multilayer module formed in accordance with one embodiment of the invention.

An application of the invention is illustrated in FIG. 19 of the drawings which represents a multi-chip substrate for micro computer use. In this embodiment of the invention, there is shown a small module with several signal layers having fine conductor and via sizes in permanent dielectric layers. The module comprises substrate 70 having photo mask layer 71 in a grid type array of vias and conductors 72. An electroless plating catalyst (not shown) would be present between the substrate and the layer of photo mask 71 and deposited copper 72. This layer is overcoated with a layer of photo dielectric 73 with interconnects 74 passing therethrough. The next layer, which completes this embodiment of the invention, comprises conductors 75 bounded by photo mask layer 76.

The embodiment of the invention represented in FIG. 19 is characterized by conductors and vias of extremely small dimension. Because the layers are formed using photo active materials with high resolution capability and good dielectric properties, vias and conductor lines can be formed with widths of from about 1 to 10 mils with the vias spaced from about 1 to 50 mils on center. Dependent on the resolution capabilities of the photo dielectric used, it would be possible to have more than 100 lines and spaces per linear inch and in some instances, greater than 400 lines and spaces. This permits the formation of a multilayer module with extreme densification believed to be heretofore unavailable in the art.

Figure 20:
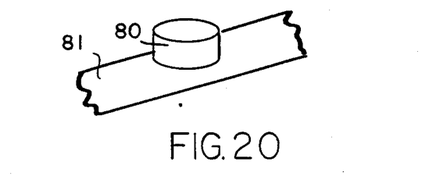
FIG. 20 represents one embodiment of an interconnection formed using a photoformed opening in accordance with the invention.

As described above, the photoformed openings may be of any desired shape or size. In this respect, the invention described herein permits formation of through-hole interconnects that could not be achieved with prior art processes. For example, as shown in FIG. 20, an interconnect 80 can be placed directly within the confines of a conductor 81 without degradation of the current carrying capacity of the interconnect because of its elliptical shape.

The procedures described above in reference to the drawings illustrate the major steps in the process contemplated by the invention. It should however be obvious that many of the procedural steps known in the art have been omitted. For example, it is known in the art that when using organic coating materials, baking for drying and curing are recommended and art recognized procedures. Likewise, to adhere one organic coating to another, it is often necessary to pretreat the coating to enhance adhesion. In catalysis processes, it is conventional to treat the catalyst with an accelerator prior to plating. To prepare copper for subsequent deposition or for adhesion of an organic coating material to it, it is often necessary to clean and activate the copper. These are all steps known to the art and not described in detail herein.

When selective metalization utilizes an electroless plating catalyst, the plating catalyst is adsorbed onto the innerlayer material prior to metalization. Known plating catalysts typically comprise tin-palladium colloids where the colloids adsorb from suspension onto the surface of a substrate as a thin layer of discreet particles. Such catalysts are disclosed in U.S. Pat. No. 3,011,920 incorporated herein by reference. Other catalysts known to the art may also be used such as those formed from copper. In those processes using a photo mask applied over a catalytic surface, the preferred catalysts are those that are the subject of copending U.S. patent application Ser. No. 06/607,649, filed May 7, 1984 U.S. Pat. No. 4,634,468 assigned to the same assignee as the subject application and incorporated herein by reference. These catalysts are tin free noble metal catalysts comprising a catalytic adsorbate in an aqueous solution of a reduced noble catalytic metal firmly associated with or fixed onto an organic suspending agent.

The photo mask and photo dielectric used in the processes of the invention should have an adequate dielectric constant so as to adequately electrically insulate conductors from each other. In this respect, a dielectric constant of not greater than 4.5 is preferred and a dielectric constant not exceeding 3.5 is more preferred.

In addition to the above, the photo mask and photo dielectric should be capable of yielding images of satisfactory resolution. The necessary resolution is dependent upon the requirements of the multilayer board. Preferably, the resolution should be sufficient to provide line widths not exceeding 10 mils, preferably not exceeding 5 mils, and most preferably, not exceeding 2 mils. The interconnection openings desirably do not exceed 5 mils and preferably are of a diameter less than the line width of the signal lines.

The photo mask and photo dielectric should also be resistant to attack by an electroless plating solution over periods of prolonged exposure. Electroless copper plating solutions are usually strongly alkaline. Therefore, the plating resist should be resistant to attack by alkaline solutions. Where the mask is to be photo imaged, it should be capable of clean development. Materials suitable for this purpose are disclosed in U.S. Pat. No. 4,439,517 incorporated herein by reference. The light sensitive formulations in accordance with said patent comprise:

(A) an epoxide resin and
(B) an effective amount of
  (i) a benzenoid polyamine,
  (ii) an aromatic compound which liberates an acid on exposure to actinic radiation, selected from
    (a) chlorides, bromides, and iodides of onium bases of elements in Group VA, VIA, or VIIA of the Periodic Table,
    (b) N-sulphonyloxyimides, and esters of sulphonic acids with B-hydroxypropiophenones or with o-hydroxyacylphenones,
    (c) o-nitrobenzaldehydes, and
    (d) alpha-chloroacylphenones and a-bromoacylphenones.

The ingredients are dissolved in a suitable organic solvent such as cyclohexanone using sufficient solvent to provide a liquid coating composition.

The above coating composition can be applied in any manner known to those skilled in the art. For example, they may be applied as a liquid coating composition and dried. Alternatively, they may be applied as a preformed dry film for thickness control. Further, they may be applied as a preformed multilayer film. Once coated and dried (if applied as a liquid coating composition), the composition is irradiated by exposure to actinic radiation of suitable wavelength such as a wavelength from 200 to 600 nm for the above formulation. Mercury vapor arcs are particularly useful for exposure. Following exposure, the exposed photosensitive plating resist is heat cured at a temperature of from 100° to 140° centigrade for from 2 to 25 minutes. The part is developed by dissolving the uncured portions of the resist with a solvent such as cyclohexanone, 2-ethoxyethanol, toluene, acetone, etc.

Though the invention has been described using the example set forth above, it should be understood that the invention is useful for many other methods for the manufacture of multilayer boards.

What is claimed is:

1. A process for the formation of a multilayer printed circuit board, said process comprising the steps of providing a non-conductive carrier having a circuit pattern over at least one of its surfaces, applying a first permanent photo dielectric coating over the circuit pattern, exposing the permanent photo dielectric coating to activating radiation in an image pattern comprising an array of openings at locations where interconnections are desired and developing said imaged photo dielectric coating to provide photoformed openings, selectively providing an electroless plating catalyst within said photoformed openings and plating electroless copper onto said electroless plating catalyst to render the photoformed openings conductive, applying a permanent photo mask over the metalized layer of interconnections, exposing the permanent photo mask to activating radiation in an image pattern comprising an array of conductors and interconnections at desired locations, developing said imaged photo mask to provide photoformed conductor lines where conductors are desired and photoformed openings where interconnections are desired and selectively providing an electroless plating catalyst within said photoformed openings and plating electroless copper onto said electroless plating catalyst to render said photoformed openings conductive and repeating the process sequentially until the desired number of layers are formed.

2. The process of claim 1 where the photoformed openings for interconnections are in electrical communication with circuits on either side of the openings.

3. The process of claim 1, where deposited metal is retained by the walls of the openings into which it is plated.

4. The process of claim 1 where the electroless metal is plated to a thickness essentially the same as the thickness of the mask whereby the surface of the circuit is essentially planar.

5. The process of claim 1 including the step of separating multiple layers of circuits and interconnections with an innerlayer material having a ground and/or power plane on its surfaces.

6. The process of claim 1 including the step of laminating one or more stacks of multiple layers of circuits and interconnections to additional stacks of multiple layers of circuits and interconnections.

7. The process of claim 1 where the stacks are laminated using a B stage resin applied as a liquid and partially cured prior to stacking.

* * * * *